United States Patent [19]
Nguyen

[11] Patent Number: 5,270,580
[45] Date of Patent: * Dec. 14, 1993

[54] PULSE GENERATOR CIRCUIT FOR PRODUCING SIMULTANEOUS COMPLEMENTARY OUTPUT PULSES

[75] Inventor: Huy S. Nguyen, Fremont, Calif.

[73] Assignee: Fujitsu Limited, Kawasaki, Japan

[*] Notice: The portion of the term of this patent subsequent to Jul. 14, 2009 has been disclaimed.

[21] Appl. No.: 875,045

[22] Filed: Apr. 28, 1992

Related U.S. Application Data

[63] Continuation of Ser. No. 738,158, Jul. 29, 1991, Pat. No. 5,130,566.

[51] Int. Cl.⁵ .............................................. H03K 5/13
[52] U.S. Cl. ..................................... 307/269; 307/265; 328/63
[58] Field of Search ............... 307/269, 265, 480, 262; 328/62, 63, 60, 59

[56] References Cited

U.S. PATENT DOCUMENTS

| | | | |
|---|---|---|---|
| 4,069,429 | 1/1978 | White | 307/208 |
| 4,574,203 | 3/1986 | Baba | 307/269 |
| 4,617,477 | 10/1986 | DePaolis, Jr. | 307/443 |
| 4,645,947 | 2/1987 | Prak | 307/269 |
| 4,783,604 | 11/1988 | Ueno | 307/269 |
| 4,950,920 | 8/1990 | Hara et al. | 307/269 X |
| 5,041,738 | 8/1991 | Walters, Jr. | 307/269 |
| 5,130,566 | 7/1992 | Nguyen | 307/265 |

FOREIGN PATENT DOCUMENTS

| | | |
|---|---|---|
| 0310232 | 4/1989 | European Pat. Off. . |
| 0431761A2 | 6/1991 | European Pat. Off. . |
| 59-097222 | 6/1984 | Japan . |
| 60-075121 | 4/1985 | Japan . |
| 62-189811 | 8/1987 | Japan . |
| 2-128517 | 5/1990 | Japan . |

Primary Examiner—William L. Sikes
Assistant Examiner—Toan Tran
Attorney, Agent, or Firm—Christie, Parker & Hale

[57] ABSTRACT

A pulse generator circuit is disclosed which is constructed using MOSFET transistors, and which provides substantially simultaneous complementary output pulses in response to a clock input signal. In one embodiment, the output pulses are provided in response to the positive edge of the clock input signal, and in a second embodiment, the output pulses are provided in response to a negative edge of the clock input signal. The transconductances of the transistors are set to enhance the circuit performance.

20 Claims, 9 Drawing Sheets

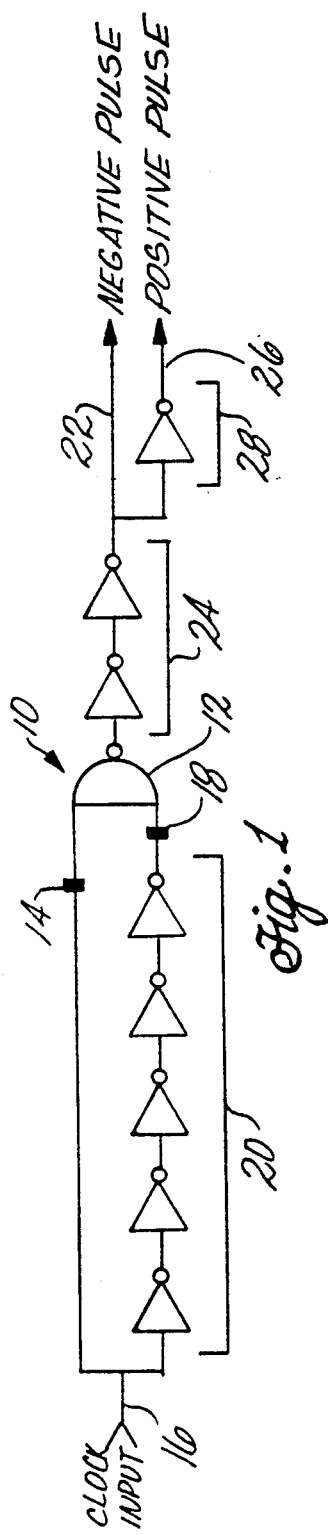
*Fig. 1*
PRIOR ART
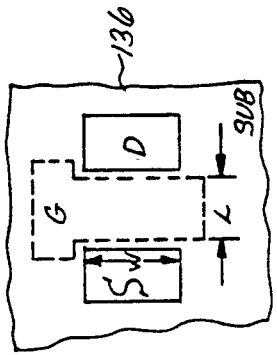
*Fig. 7*
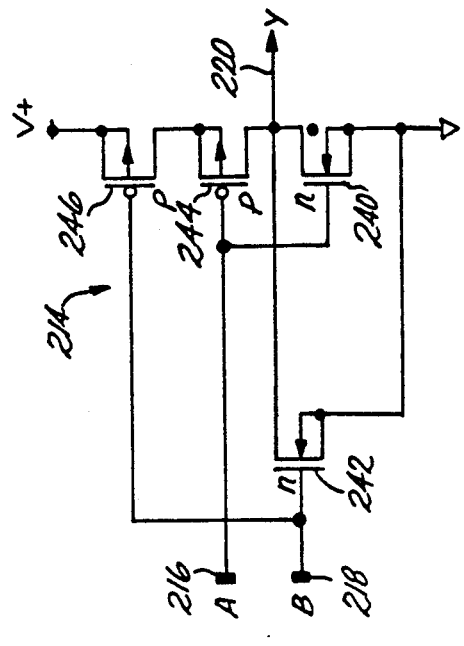
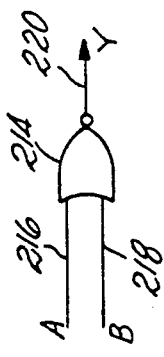
*Fig. 9*

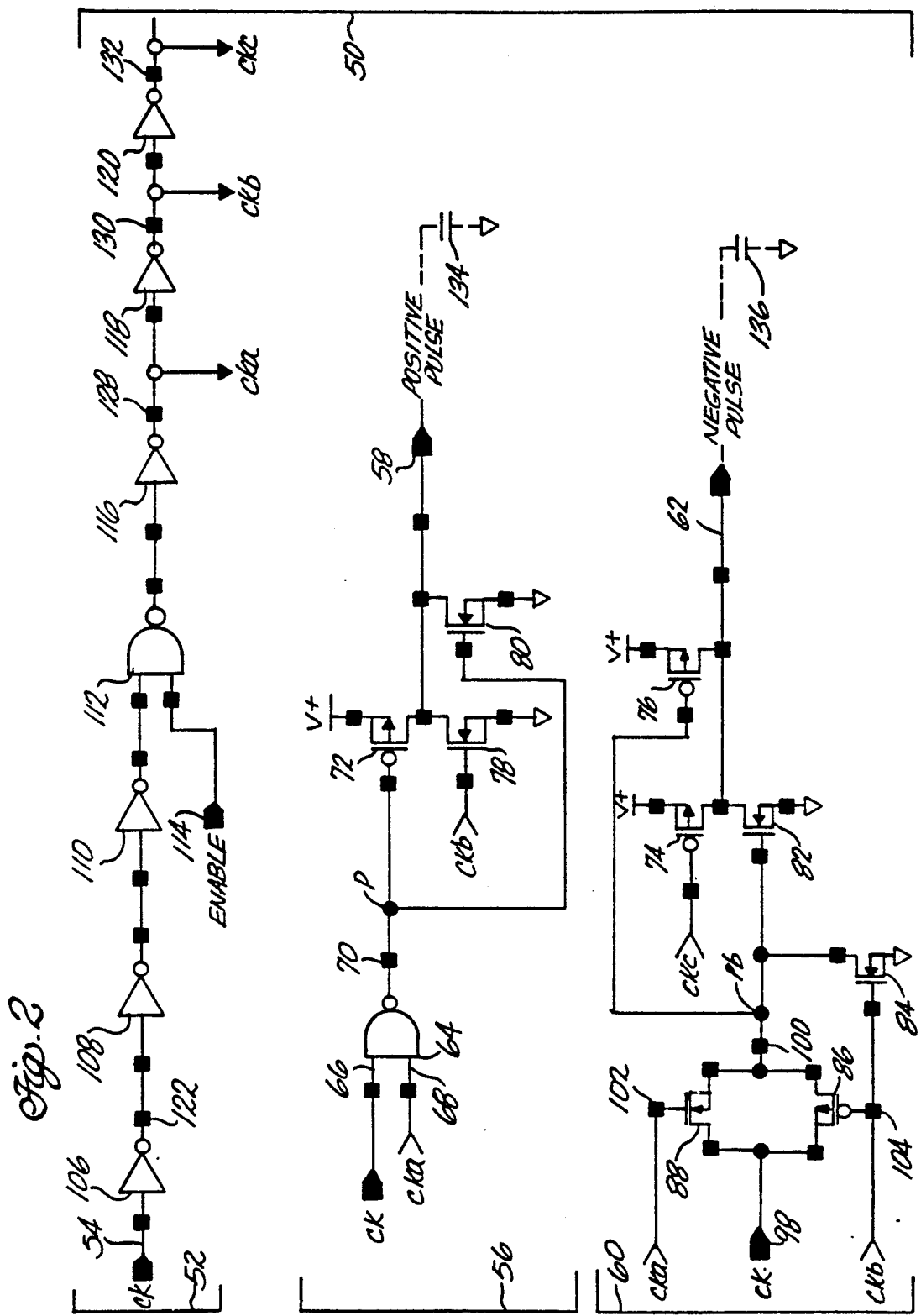

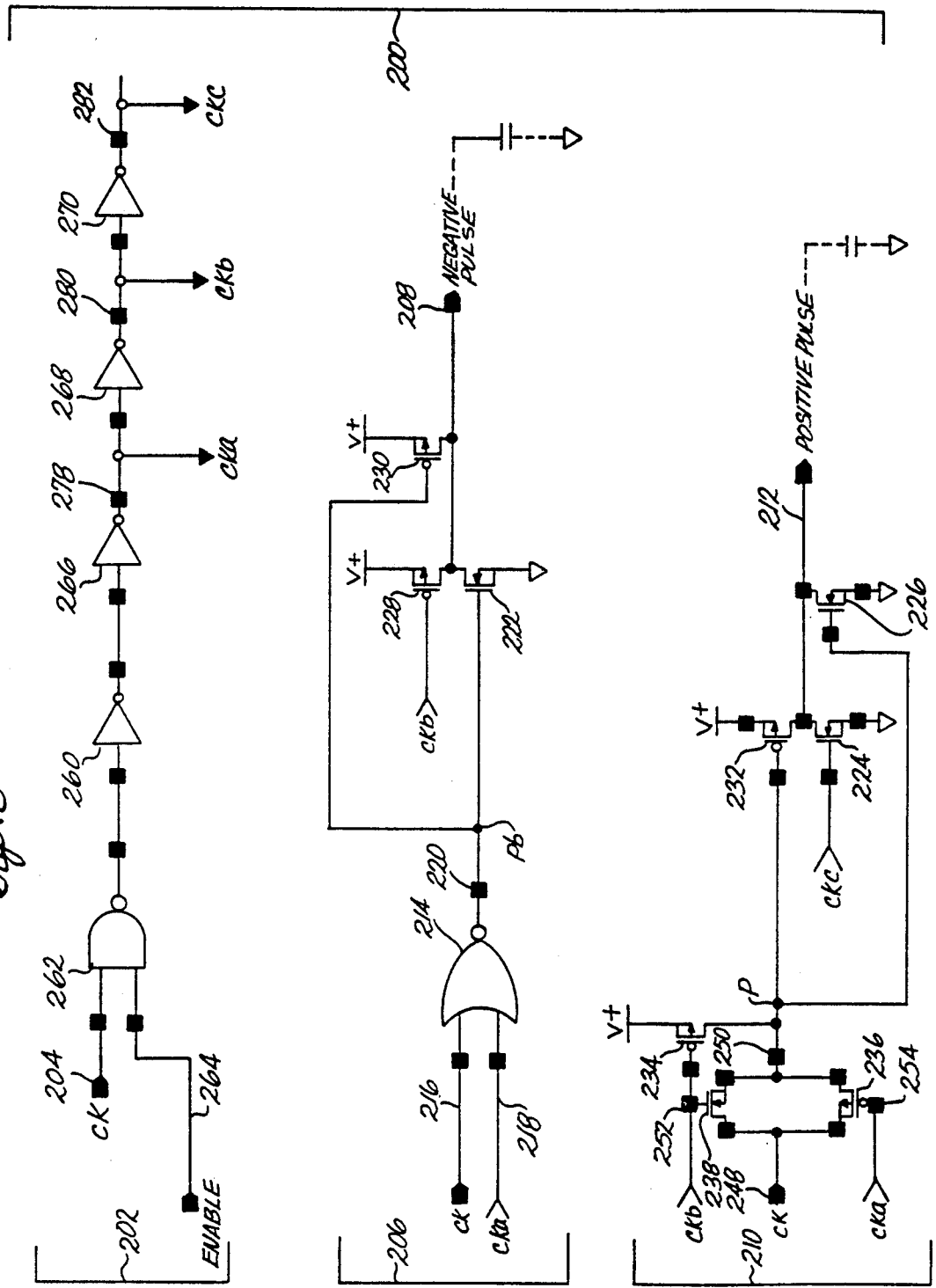

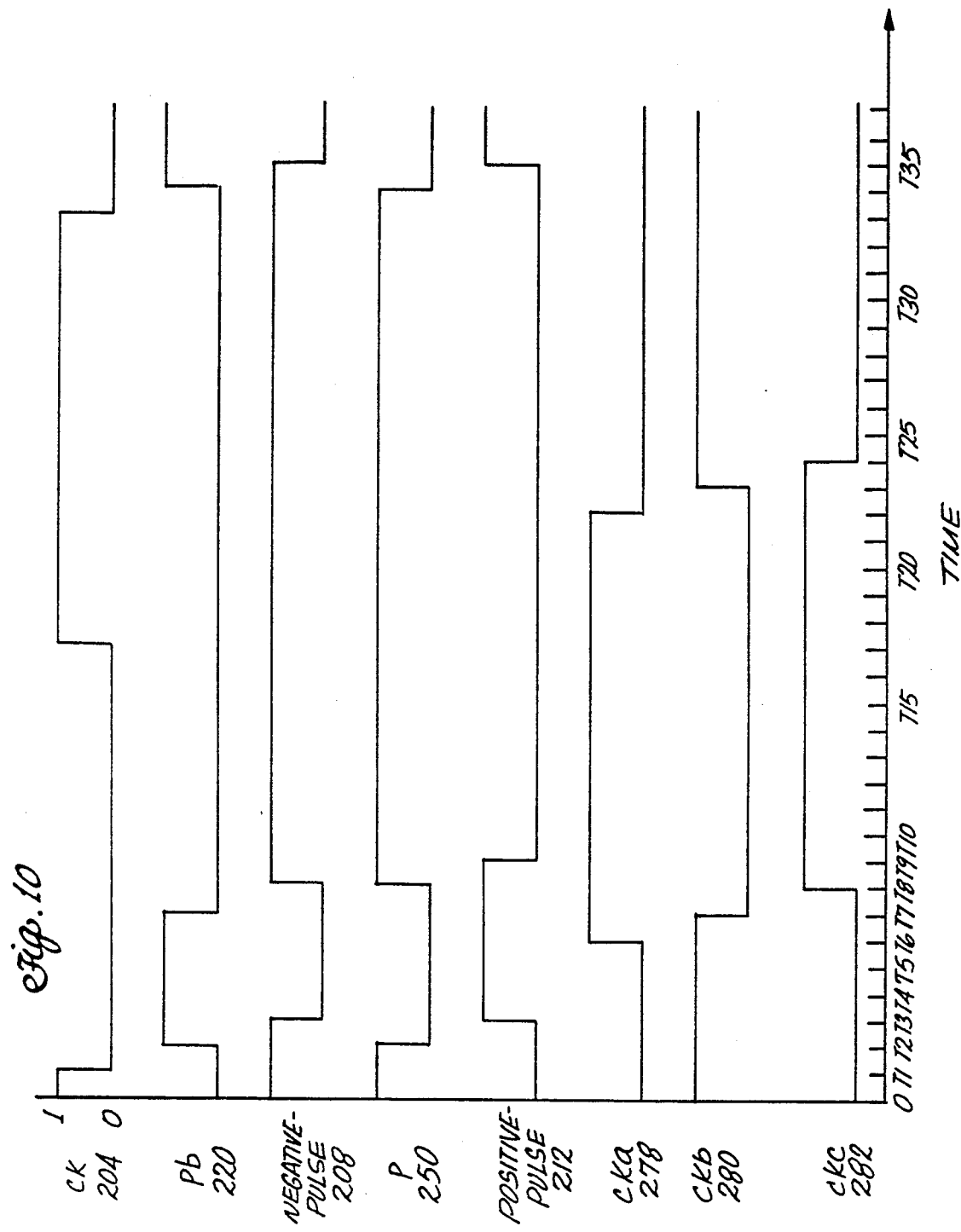

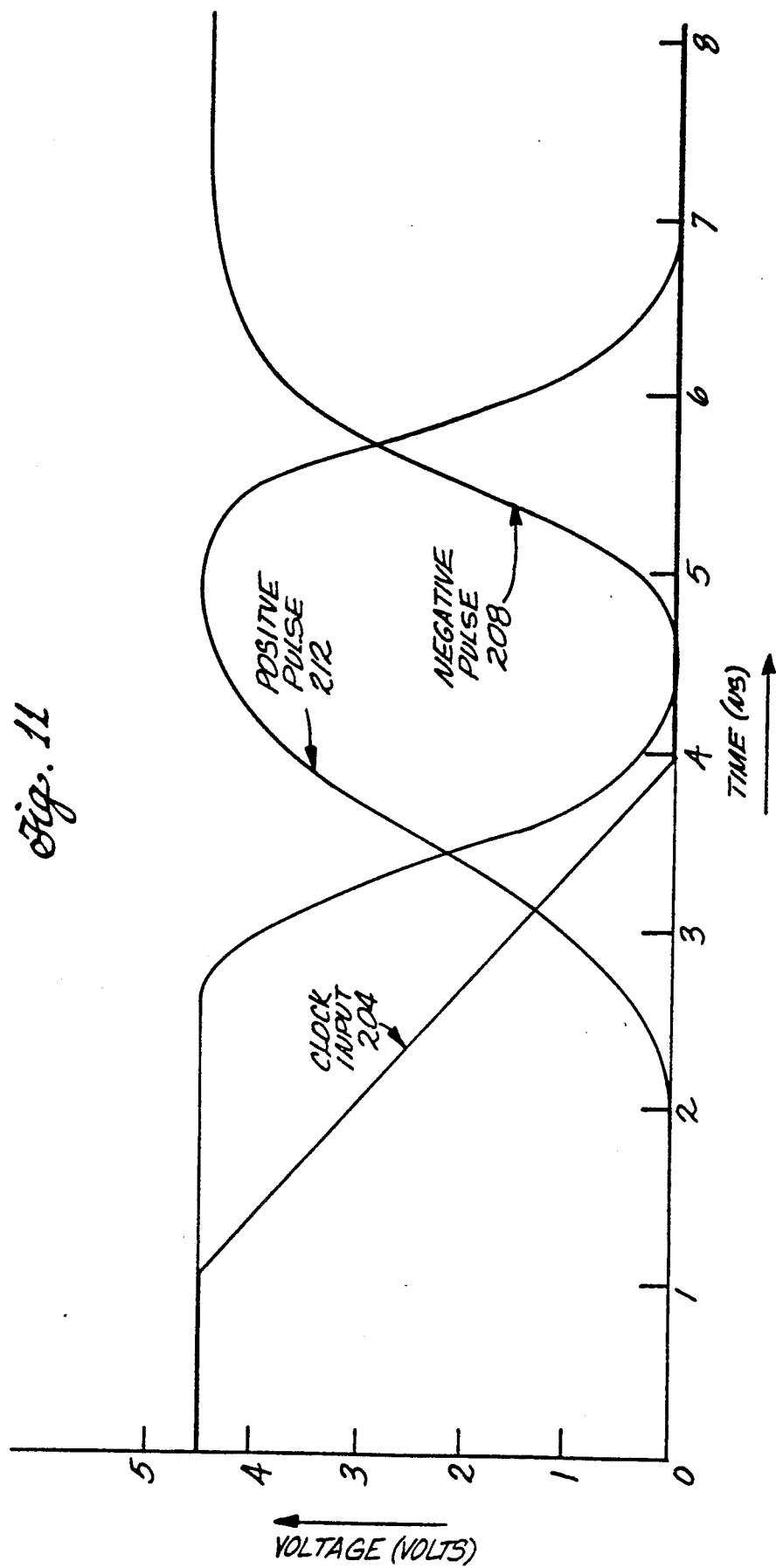

PULSE GENERATOR CIRCUIT FOR PRODUCING SIMULTANEOUS COMPLEMENTARY OUTPUT PULSES

RELATED APPLICATION CROSS-REFERENCE

This application is a continuation of U.S. application Ser. No. 07/738,158 filed Jul. 29, 1991 which issued Jul. 14, 1992 as U.S. Pat. No. 5,130,566.

FIELD OF THE INVENTION

This invention relates to pulse generator circuits and, more particularly, to pulse generator circuits for producing substantially simultaneous complementary output pulses.

BACKGROUND OF THE INVENTION

A number of circuits have been devised to provide complementary (i.e. inverted and non-inverted) output pulses in response to a single clock input signal. Such circuits have a wide range of uses in digital logic systems. In particular, it is desirable to provide complementary pulses which occur essentially simultaneously with respect to each other. It is also desirable to provide substantially simultaneous complementary output pulses having a pulse width which is independent of the clock input signal pulse width, and which are generated with a minimum of delay following the leading edge of the clock input signal.

U.S. Pat. No. 4,617,477, entitled "Symmetrical Output Complementary Buffer", issued Oct. 14, 1986, to M. V. DePaolis, Jr. shows a CMOS (complimentary metal-conditions, generates nearly symmetrical complimentary output signals, but the duration of those signals is dependent upon the duration of the input signal.

U.S. Pat. No. 4,645,947, entitled "Clock Driver Circuit", issued Feb. 24, 1987, to J. Prak shows a CMOS circuit which generates complementary pulses which are delayed with respect to the leading edge of the clock input signal.

SUMMARY OF THE INVENTION

The foregoing and other objects of the invention are accomplished by providing a pulse generator circuit for producing substantially simultaneous logically complementary output pulses in response to the positive edge of a clock input signal. The circuit includes a clock section responsive to the clock input signal for providing a second clock signal which is the complement of the clock input signal and is delayed therefrom by a first delay interval, for providing a third clock signal which is in phase with the input clock signal and is delayed therefrom by a second delay interval, and for providing a fourth clock signal which is the complement of the clock input signal and is delayed therefrom by a third delay interval.

A NAND gate is provided having two input terminals and an output terminal First, second, and third transistors of a first conductivity type are provided, each having a control electrode and first and second output electrodes; fourth, fifth, sixth, and seventh transistors of a second conductivity type opposite that of the first conductivity type are also provided which have control and first and second output electrodes.

A transmission gate is included having input, output, gate and gate complement electrodes, whereby the gate transmits signals between the input and output electrodes when the gate electrode is at a high logic state and the gate complement electrode is at a low logic state.

The first output electrodes of the first, second and third transistors are connected to a first potential source; the first output terminals of the fourth, fifth, sixth and seventh transistors are connected to a second potential source having a potential level less than that of the first potential source; the second output electrodes of the first, fourth and fifth transistors are connected to form a first output node at which is produced a positive edge pulse in response to the positive edge of the clock input signal; the control electrodes of the first and fifth transistors are connected to the output terminal of the NAND gate means; the second output electrodes of the second, third and sixth transistors are connected together to form a second output node at which is produced a negative edge pulse in response to the positive edge of the clock input signal; the control electrodes of the third and sixth transistors, the second output electrode of the seventh transistor, and the output terminal of the transmission gate means are connected together; the control electrode of the seventh transistor is connected to the gate complement electrode of the transmission gate; the clock input signal is provided to one input terminal of the NAND gate, and to the input electrode of the transmission gate; the second clock signal is provided to the other input terminal of the NAND gate, and to the gate electrode of the transmission gate; the third clock signal is provided to the control electrodes of the fourth and seventh transistors; and the fourth clock signal is provided to the control electrode of the second transistor.

In a second embodiment of the invention, a pulse generator circuit is provided for producing substantially simultaneous logically complementary output pulses in response to the negative edge of a clock input signal. The circuit includes a clock section responsive to the clock input signal for providing a second clock signal which is the complement of the clock input signal and is delayed therefrom by a first delay interval, for providing a third clock signal which is in phase with the input clock signal and is delayed therefrom by a second delay interval, and for providing a fourth clock signal which is the complement of the clock input signal and is delayed therefrom by a third delay interval.

A NOR gate is provided having two input terminals and an output terminal. First, second, and third transistors of a first conductivity type are provided, each having a control electrode and first and second output electrodes; fourth, fifth, sixth, and seventh transistors of a second conductivity type opposite that of the first conductivity type are also provided which have control and first and second output electrodes.

A transmission gate is included having input, output, gate and gate complement electrodes, whereby the gate transmits signals between the input and output electrodes when the gate electrode is at a high logic state and the gate complement electrode is at a low logic state.

The first output electrodes of the first, second and third transistors are connected to a first potential source; the first output terminals of the fourth, fifth, sixth and seventh transistors are connected to a second potential source having a potential level greater than that of the first potential source; the second output electrodes of the first, fourth and fifth transistors are connected to form a first output node at which is produced a negative edge pulse in response to the negative edge of the clock input signal; the control electrodes of the first and fifth transistors are connected to the output terminal of the NOR gate means; the second output electrodes of the second, third and sixth transistors are connected together to form a second output node at which is produced a positive edge pulse in response to the negative edge of the clock input signal; the control electrodes of the third and sixth transistors, the second output electrode of the seventh transistor, and the output terminal of the transmission gate means are connected together; the control electrode of the seventh transistor is connected to the gate electrode of the transmission gate; the clock input signal is provided to one input terminal of the NOR gate, and to the input electrode of the transmission gate; the second clock signal is provided to the other input terminal of the NOR gate, and to the gate complement electrode of the transmission gate; the third clock signal is provided to the control electrodes of the fourth and seventh transistors; and the fourth clock signal is provided to the control electrode of the second transistor.

BRIEF DESCRIPTION OF THE DRAWINGS

FIG. 1 is a schematic diagram of a prior art circuit for generating complementary output pulses;

FIG. 2 is a schematic diagram of an MOS circuit constructed in accordance with a first embodiment of the invention and which generates substantially simultaneous complementary output pulses in response to the positive edge of a clock input signal;

FIG. 7 is a top schematic view, not to scale, of a typical MOS transistor used in the circuit of FIG. 2, showing the relative position and dimensions of the gate with respect to the source and drain elements thereof;

FIG. 8 is a schematic diagram of an MOS circuit constructed in accordance with a second embodiment of the invention and which generates substantially simultaneous complementary output pulses in response to the negative edge of a clock input signal;

FIG. 9 is a schematic diagram showing the MOS circuit used to implement a NOR gate used in the circuit of FIG. 8;

FIG. 10 is a timing diagram showing the time relationship of various signals in the circuit of FIG. 8;

FIG. 11 is a graph showing the input and output waveforms of the circuit of FIG. 8.

DISCUSSION OF THE PRIOR ART

Figures 3, 4:
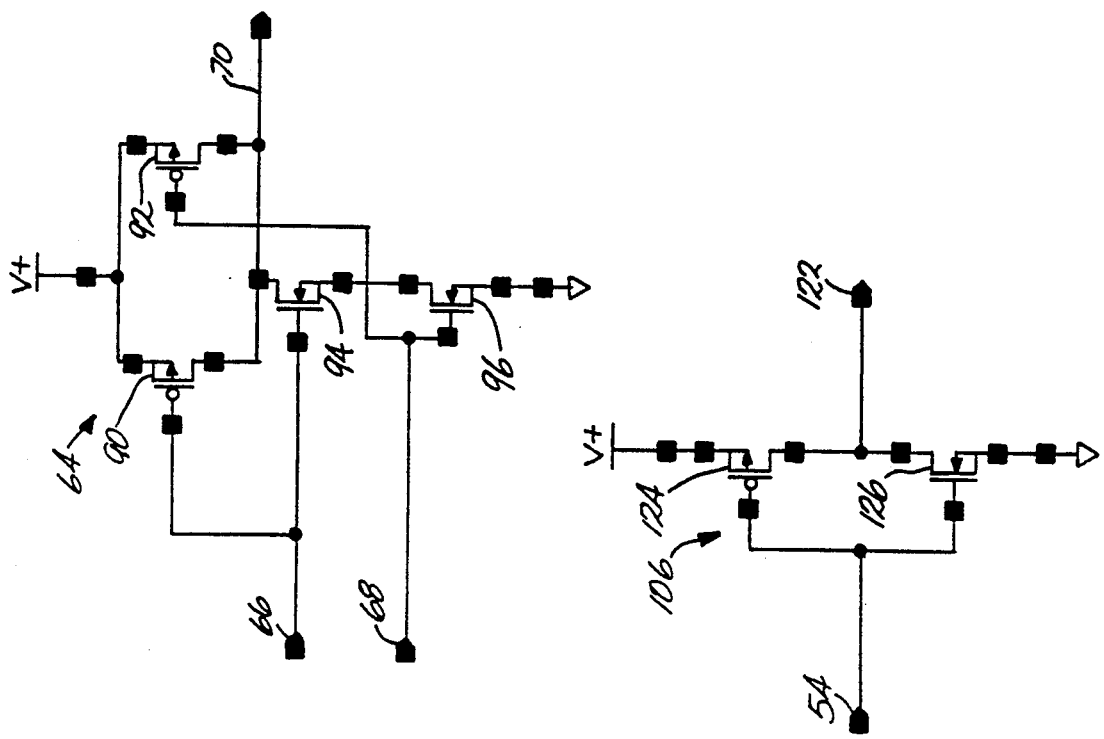
FIG. 3 is a schematic diagram showing the MOS circuit used to implement a NAND gate used in the circuit of FIG. 2.
FIG. 4 is a schematic diagram showing the MOS circuit used to implement inverters used in the circuit of FIG. 2.

FIG. 1 shows a typical prior art circuit 10 used to generate complementary output pulses in response to a positive edge of a clock input signal. The circuit 10 is typically fabricated using CMOS elements and includes a NAND gate 12 having a first input terminal 14 connected to a clock input signal terminal 16, and having a second input terminal 18 connected to the clock terminal 16 through a series chain of an odd number (e.g. five) of inverters 20. The output terminal of the gate 12 is connected to a negative pulse output terminal 22 through a series of an even number (e.g. two) of inverters 24, and a positive pulse output terminal 26 is connected to the terminal 22 via an odd number (e.g. one) of inverters 28.

The operation of the circuit 10 is as follows. With the clock signal at the terminal 16 in a low state, node 14 is low, and node 18 is high due to the signal inversion from the odd number of inverters 20. Accordingly, the output signal from NAND gate 12 is high, as is the signal at the negative pulse output terminal 22 (since the chain of even number of inverters 24 produces no inversion), and the signal at the positive output terminal 26 is low as a result of the inversion of the inverter chain 28.

When the clock signal at the terminal 16 switches to a high state, node 14 immediately becomes high, and node 18 remains in the high state as a result of the signal delays inherent in each of the inverters in the chain 20. Since nodes 14 and 18 are high the output signal from the gate 12 switches low, the signal at the negative output terminal switches low, and the signal at the positive output terminal switches high. At the end of a delay time corresponding to the sum of the signal delays of each of the inverters in the chain 20, the node 18 switches low, the gate 12 output signal switches high, as does the signal at the negative output terminal 22, while the signal at the positive output terminal switches low.

From the above description, it may be seen that the circuit 10 produces both positive and negative pulses at the output terminals 26 and 22, respectively, in response to the clock input signal switching from a low logic level to a high logic level. There are several drawbacks to the operation of the circuit 10, one of which is a substantial delay between the rising edge of the clock signal and the initial transition of the output pulse signals. This delay is caused in part by the need for the inverter chain 24, the purpose of which is to buffer the NAND gate 12 from the external loads connected to the output terminals 22 and 26. Another drawback to the circuit 10 is that the number of gate delays between the clock input signal terminal 16 and the output terminals 22 and 26 are not equal. Thus, in the example shown, there are three gate delays (12, 24) in the negative output pulse path, and four gate delays (12, 24, 28) in the positive output pulse path. The effect of this uneven delay is to skew the relative timing of the positive and negative output pulses so that they do not occur simultaneously. Yet another drawback of the circuit 10 is that the P-channel and N-channel CMOS transistors in the inverters, particularly those driving the output loads, are both on for a short duration during signal level changes. The result is large transient current spikes appearing on the power supply lines, as well as an increase in the output pulse rise and fall times.

DETAILED DESCRIPTION

FIG. 2 is a schematic diagram of a first embodiment of the invention in the form of a circuit 50 employing metal oxide semiconductor field effect transistors (MOSFETS) to generate substantially simultaneous complementary output pulses in response to the positive edge of a clock input signal. All of the MOSFETS in the circuit 50 include gate, source and drain electrodes. The circuit 50 is conveniently divided into three sections, a clock generating section 52 responsive to a clock input signal (hereinafter "ck") provided to a clock input terminal 54, a positive pulse generating section 56 responsive to the clock input signal and signals from the section 52 to provide a positive edge pulse at positive pulse output terminal 58 in response to the positive edge of the clock input signal, and a negative pulse generating circuit 60 responsive to the clock input signal and signals from the section 52 to provide a negative edge pulse at negative pulse output terminal 62 in response to the positive edge of the clock input signal.

The circuit 50 includes a NAND gate 64 having first and second input terminals 66 and 68, respectively, and an output terminal 70; first, second and third p-channel MOSFETS 72, 74, and 76, respectively; fourth, fifth, sixth and seventh n-channel MOSFETS 78, 80, 82, and 84, respectively; and a transmission gate comprising eighth p-channel MOSFET 86 in combination with ninth n-channel MOSFET 88. The equivalent circuit of the NAND gate 64 is shown in FIG. 3. The gate 64 includes tenth and eleventh p-channel MOSFETS 90 and 92, respectively, and twelfth and thirteenth n-channel MOSFETS 94 and 96, respectively.

The gate electrodes of the transistors 90 and 94 are connected together to the input terminal 66, the gate electrodes of the transistors 92 and 96 are connected together to the input terminal 68, the drain electrodes of the transistors 90, 92, and 94 are connected together to the output terminal 70, the source electrodes of the transistors 90 and 92 are connected to a voltage source V+, the source electrode of the transistor 94 is connected to the drain electrode of the transistor 96, and the source electrode of the transistor 96 is connected to ground.

Returning to section 56 of FIG. 2, the output terminal 70 (hereinafter node "p") of the NAND gate 64 is connected to the gate electrodes of the transistors 72 and 80, the drain electrodes of the transistors 72, 78 and 80 are connected together to the output terminal 58, the source electrodes of the transistors 78 and 80 are connected to ground, and the source electrode of the transistor 72 is connected to a voltage source V+, which is typically 5 volts.

In section 60, the transistors 86 and 88 are connected together to form a transmission gate having an input terminal 98, an output terminal 100 (hereinafter node "pb"), a gate terminal 102 and a gate complement terminal 104. The drain electrode of the transistor 88 is connected together with the source electrode of the transistor 86 to the input terminal 98, the source electrode of the transistor 88 is connected together with the drain terminal of the transistor 86 to the output terminal 100, and the gate electrodes of the transistors 88 and 86 are connected to the gate terminals 102 and 104, respectively. The transmission gate 86,88 operates to transmit signals from input terminal 98 to output terminal 100 when the gate electrode 102 is at a high logic state and the gate complement electrode 104 is at a low logic state.

The output terminal 100 is connected to the gate electrodes of the transistors 76 and 82, and to the drain electrode of the transistor 84. The drain electrodes of the transistors 74, 76 and 82 are connected together to the output terminal 62, the source terminals of the transistors 74 and 76 are connected to V+, the source electrodes of the transistors 82 and 84 are connected to ground, and the gate electrode of the transistor 84 is connected to the gate complement terminal 104.

The section 52 includes three inverters 106, 108, and 110, each having an input and an output terminal. These inverters are connected in a series chain between the clock input terminal 54 and one input terminal of a second NAND gate 112, the other input terminal of which is connected to an enable signal input terminal 114. The output terminal of the gate 112 is connected to a second series chain of three inverters 116, 118, and 120, respectively. The equivalent circuit of the NAND gate 112 is substantially identical to the circuit shown in FIG. 3 for the NAND gate 64.

Each of the six inverters in the section 52 is formed of substantially the same equivalent circuit. A typical equivalent circuit for the inverter 106 is shown in FIG. 4. The gate electrodes of a p-channel and an n-channel transistor 124, 126, respectively, are connected together to input terminal 54, the drain terminals of the transistors 124, 126 are connected together to output terminal 122, the source electrode of transistor 124 is connected to V+, and the source electrode of transistor 126 is connected to ground.

Returning to FIG. 2, the signal (hereinafter "cka") appearing at output terminal 128 of inverter 116 is provided to input terminal 68 of gate 64, and to gate electrode 102 of transistor 88; the signal (hereinafter "ckb") appearing at output terminal 130 of inverter 118 is provided to the gate electrode of transistor 78 and to the gate electrode 104 of transistor 86; the signal (hereinafter "ckc") appearing at output terminal 132 of inverter 120 is provided to the gate terminal of the transistor 74, and the clock input signal appearing at the terminal 54 is provided to the input terminal 66 of the gate 64 and to the input terminal 98 of the transmission gate 86,88.

Figure 5:
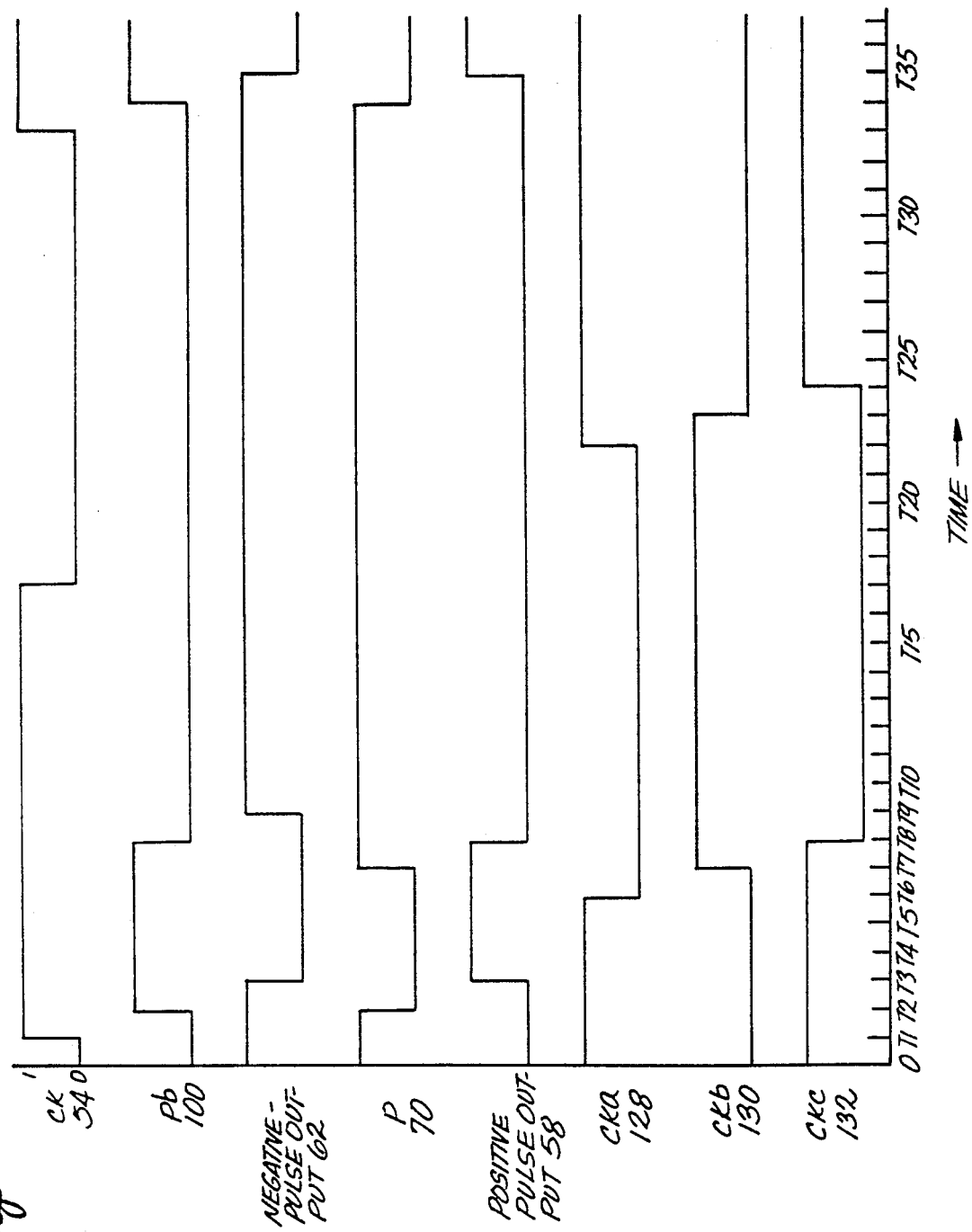
FIG. 5 is a timing diagram showing the time relationship of various signals in the circuit of FIG. 2.

The operation of the circuit 50 is as follows, where reference is made to FIG. 2 and to FIG. 5, which is a timing diagram showing the time relationship of the signals appearing at various points in the circuit 50. In particular, the signals ck, cka, ckb, and ckc are shown, along with the signals appearing at the nodes p and pb, and at the positive and negative edge pulse output terminals 58 and 62, respectively. It is presumed that the enable signal terminal 114 is connected to a high logic state, so that the gate 112 acts as an inverter with respect to the signals appearing at its other input terminal. With the clock input signal ck in a low logic state at time zero, cka is at a high state as a result of the odd number of inverters (five) between terminals 54 and 128. Similarly, ckb is at a low state as a result of inverter 130, and ckc is at a high state as a result of inverter 120.

Because cka is high and ckb is low, transmission gate 86,88 conducts and provides the low state ck signal to the node pb. Since ckb is low, transistor 84 is off, and does not load the node pb. With node pb low, transistor 76 is on, and maintains the negative-edge pulse output signal level at output terminal 62 in a high state. The low state ck signal also causes a high state signal to appear from gate 64 at node p, turning transistor 72 off and turning transistor 80 on, which maintains the positive-edge pulse signal appearing at output terminal 58 in a low state.

At a time t1, input signal ck switches to a high state. As a result of the propagation delays caused by the inverter chain 106, 108, 110, 112 and 116, signals cka and ckc still remain high and ckb remains low. Thus, transmission gate 86,88 remains conducting and the high value of ck propagates to node pb at a time t2 delayed from t1 by the propagation delay of the gate 86,88. The high signal at node pb turns on transistor 82 and turns off transistor 76, thus pulling the negative pulse output signal at terminal 62 to a low level at a time t3 delayed from time t2 by the propagation delay of transistors 76 and 82.

In section 56, the action of ck switching to a high state causes the gate 64 and hence the node p to switch low at the time t2, delayed from t1 by the delay of the gate 64. This action turns off transistor 80 and turns on transistor 72, pulling the positive-edge pulse signal at terminal 58 to a high state at time t3 delayed from t2 by the delay of transistors 72 and 80.

At a time t6 delayed from time t1 by the cumulative delays of the inverters 106, 108, 110, 112, and 116, the change in state of signal ck propagates to terminal 128 and causes cka to switch low. At time t7 delayed from t6 by the delay of inverter 118, the signal ckb switches high, and at a time t8 delayed from t7 by the delay of inverter 120, the signal ckc switches low. The transmission gate 86,88 turns off, turning on transistor 84 which pulls node pb to a low state at time t8, which in turn turns off transistor 82.. The low value of ckc turns on transistor 74, which pulls the negative-edge pulse output signal at terminal 62 to a high value at time t9 delayed from t8 by the delay of transistor 74.

In section 56, the low level of cka causes gate 64 to pull node p to a high level at time t7, turning off transistor 72. The high level of ckb turns on transistor 78, which pulls the positive-edge pulse signal at terminal 58 to a low level at time t8. When the clock signal ck subsequently returns to a low level, the values of the various signals are reset to those shown at time t0 in FIG. 5.

Figure 6:
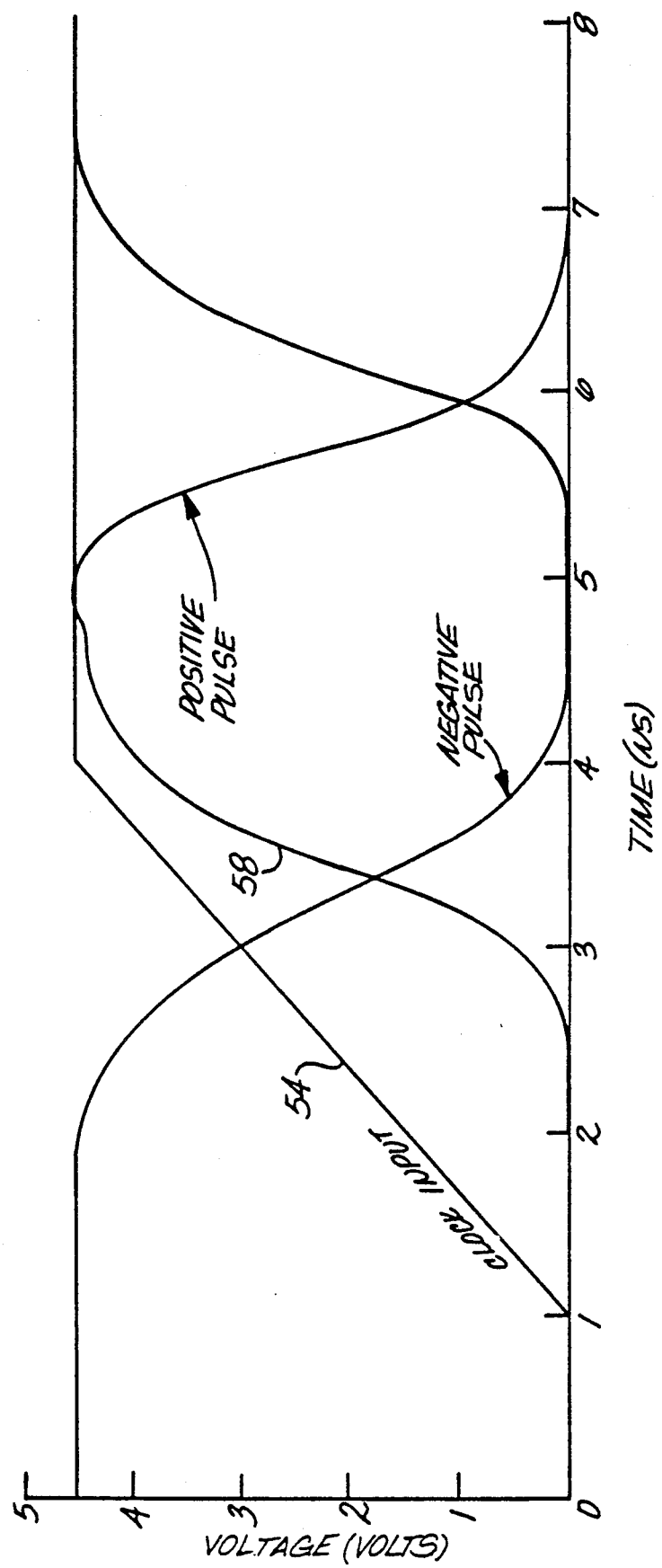
FIG. 6 is a graph showing the input and output waveforms of the circuit of FIG. 2.

FIG. 6 is a graph showing the positive and negative pulses produced at the terminals 58 and 62, respectively, of circuit 50 in response to the leading edge of clock input signal ck having a rise time of three ns. Note the short delay in pulse generation from the start of the clock signal positive edge, and also note the nearly simultaneous time relationship between the complementary pulses.

One feature of the circuit 50 is that the negative and positive pulse output driver transistors 74 and 78, respectively, are off when the clock input signal ck is low, leaving only the pull up transistor 76 and the pull down transistor 80 to establish proper output signal logic levels. As shown below, the transistors 76 and 80 are designed to have much lower transconductance values, and hence faster switching speeds, than that of the corresponding driver transistors 74 and 78, as well as the opposing driver transistors 72 and 82. This configuration decreases the transient currents generated during switching intervals by the output driver transistors 72 and 82. The circuit 50 is typically used to drive capacitive loads represented by capacitors 134 and 136 in FIG. 2, which may have typical values of 0.4 pf and 0.5 pf, respectively. The lower transconductance values for the transistors 76 and 80 also reduce the loading, and hence delays, caused thereby to a relatively insignificant level. Further, the delay from the clock input signal to the generation of the leading edges of the positive and negative output pulses is balanced so that these complementary pulses occur substantially simultaneously.

The transconductances of various of the transistors in the circuit 50 may be established in a predetermined relationship to enhance circuit performance as follows. It may be shown that the transconductance $g_m$ of a MOSFET is proportional to:

$$\frac{W \cdot \mu}{T \cdot L} \quad (1)$$

where W is the width of the gate channel, L is the length of the gate channel, t is the thickness of the gate insulation layer, and $\mu$ is the mobility of electrons (in the case of an n-channel MOSFET), or the mobility of holes (in the case of a p-channel MOSFET), where the mobility of holes is one half that of electrons.

From equation 1, it may be seen that transconductance is directly related to the value W/L, or the width to length ratio of the gate channel. Transconductance is thus also proportional to the loading effect (gate capacitance) of a MOSFET, as well as its response time. Transconductance is also a measure of the load driving ability of the MOSFET, since it relates to the ratio of drain current to gate voltage.

In the present invention, certain transconductance ratios may be established to enhance circuit operation. Thus, the transconductance of the pull down transistor 80 is set to be less than (for example, ¼) that of the opposing driver transistor 72. Since the purpose of the transistor 80 is simply to offset the PN junction leakage current of transistor 72, its adverse effect on circuit operation can be minimized by reducing its transconductance to a low value. In similar fashion and for similar reasons, the transconductance of the pull up transistor 76 is set to be less than (for example, 1/25) that of the opposing driver transistor 82. Also, the transconductance of the transistors 76 and 80 is set to be less than that of transistors 74 and 78, respectively. The transconductance values of the driver transistors 72, 74, 78 and 82 are set to give the desired output pulse switching performance in consideration of the size of the loads to be driven.

The transconductance values of the transistors 86 and 88 are set substantially equal to each other to balance signal transmission performance. The transconductance values of the p-channel and n-channel transistors in each of the inverters in the circuit 50 are set substantially equal to each other to set the switching points of these elements to about one half the value of V+. The transconductance of the transistor 90 in the NAND gate 64 is set to be smaller than (for example, ¼) that of the transistor 92 to ensure a sharp fall time at node p when ck switches to a high level. The transconductance values of the other transistors in the circuit 50 are set as low as possible to minimize layout size and response time, while maintaining the capability of driving their intended loads.

It is envisioned that the circuit 50 will be produced as a monolithic integrated circuit, where all transistors are fabricated having essentially the same gate insulation layer thickness. Further, for ease of fabrication the length of the gate channels for all transistors is set to the same value, which is the minimum practical value attainable with the particular fabrication process used. FIG. 7 is a top schematic view, not to scale, of a typical integrated circuit showing the relative position of the various elements (source, drain, gate, substrate) of a MOSFET 136.

In the present case, the fabrication process envisioned for making the circuit 50 is that used by Fujitsu Microelectronics Corporation, Tokyo, Japan, which can achieve minimum gate lengths of 1 micron, and minimum gate widths of 2.56 microns. In view of the above and by way of example, but not of limitation, the following W/L ratios are suitable for use in fabricating the various transistors in the circuit 50:

| TRANSISTOR NO. | W/L RATIO |
|---|---|
| 72 | 40.96 |
| 74 | 48.0 |
| 76 | 2.56 |
| 78 | 27.52 |
| 80 | 2.56 |
| 82 | 32.0 |
| 84 | 6.4 |
| 86 | 12.8 |
| 88 | 6.4 |
| 90 | 6.4 |
| 92 | 12.8 |
| 94 | 12.8 |
| 96 | 12.8 |
| 124 | 5.12 |
| 126 | 2.56 |
| Gate 112 | 5.12 (all FETS) |
| 106,108,110 | p = 5.12, n = 2.56 |
| 116,118,120 | p = 12.8, n = 6.4 |

Referring to the section 52 of FIG. 2, the width of the output pulses produced by the circuit 50 is related to the number of inverters between the terminals 54 and 128. While five such elements are shown, any odd number may be used. Further, if an enable function is not desired, the gate 112 may be replaced by an inverter, Thus, the section 52 may be envisioned as a series chain of 2N+1 inverters, where N is an integer greater than or equal to 1. The output terminal of the 2N+1st inverter provides the signal ckc, the output terminal of the 2Nth inverter provides the signal ckb, and the output terminal of the 2N-1th inverter provides the signal cka. The NAND gate may be substituted for the 2N-2nd inverter.

Further, it may be shown that the circuit 50 can be used where the signals cka, ckb and ckc are rearranged in the chain whereby signal ckb is produced prior to the production of signals cka; whereby ckc is produced at substantially the same time as the signal cka; or whereby the signal ckb is produced prior to the signal cka and the signal ckc is produced at substantially the same time as the signal cka. All of these variations suffer from the fact that the various rise and fall times of the output pulses are extended, which is undesirable in many applications.

FIG. 8 is a schematic diagram of a second embodiment of the invention in the form of a circuit 200 employing metal oxide semiconductor field effect transistors (MOSFETS) to generate substantially simultaneous complementary output pulses in response to the negative edge of a clock input signal All of the MOSFETS in the circuit 200 include gate, source and drain electrodes. The circuit 200 is conveniently divided into three sections, a clock generating section 202 responsive to a clock input signal (hereinafter "ck") provided to a clock input terminal 204, a negative pulse generating section 206 responsive to the clock input signal and signals from the section 202 to provide a negative edge pulse at negative pulse output terminal 208 in response to the negative edge of the clock input signal, and a positive pulse generating circuit 210 responsive to the clock input signal and signals from the section 202 to provide a positive edge pulse at positive pulse output terminal 212 in response to the negative edge of the clock input signal.

The circuit 200 includes a NOR gate 214 having first and second input terminals 216 and 218, respectively, and an output terminal 220; first, second and third n-channel MOSFETS 222, 224, and 226, respectively; fourth, fifth, sixth and seventh p-channel MOSFETS 228, 230, 232, and 234, respectively; and a transmission gate comprising eighth p-channel MOSFET 236 in combination with ninth n-channel MOSFET 238. The equivalent circuit of the NOR gate 214 is shown in FIG. 9. The gate 214 includes tenth and eleventh n-channel MOSFETS 240 and 242, respectively, and twelfth and thirteenth p-channel MOSFETS 244 and 246, respectively.

The gate electrodes of the transistors 240 and 244 are connected together to the input terminal 216, the gate electrodes of the transistors 242 and 246 are connected together to the input terminal 218, the drain electrodes of the transistors 240, 242, and 244 are connected together to the output terminal 220, the source electrodes of the transistors 240 and 242 are connected to a ground, the source electrode of the transistor 244 is connected to the drain electrode of the transistor 246, and the source electrode of the transistor 246 is connected a voltage source V+.

Returning to section 206 of FIG. 8, the output terminal 220 (hereinafter node "pb") of the NOR gate 214 is connected to the gate electrodes of the transistors 222 and 230, the drain electrodes of the transistors 222, 228 and 230 are connected together to the output terminal 208, the source electrodes of the transistors 228 and 230 are connected to a voltage source V+, which is typically five volts, and the source electrode of the transistor 222 is connected to ground.

In section 210, the transistors 236 and 238 are connected together to form a transmission gate having an input terminal 248, an output terminal 250 (hereinafter node "p"), a gate terminal 252 and a gate complement terminal 254. The drain electrode of the transistor 238 is connected together with the source electrode of the transistor 236 to the input terminal 248, the source electrode of the transistor 238 is connected together with the drain terminal of the transistor 236 to the output terminal 250, and the gate electrodes of the transistors 238 and 236 are connected to the gate terminals 252 and 254, respectively. The transmission gate 236,238 operates to transmit signals from input terminal 248 to output terminal 250 when the gate electrode 252 is at a high logic state and the gate complement electrode 254 is at a low logic state.

The output terminal 250 is connected to the gate electrodes of the transistors 226 and 232, and to the drain electrode of the transistor 234. The drain electrodes of the transistors 224, 226 and 232 are connected together to the output terminal 212, the source terminals of the transistors 224 and 226 are connected to ground, the source electrodes of the transistors 232 and 234 are connected to V+, and the gate electrode of the transistor 234 is connected to the gate terminal 252.

The section 202 includes a series chain of a two-input NAND gate 262 and four inverters 260, 266, 268, and 270, each having an input and an output terminal. One input terminal of a the NAND gate 262 is connected to an enable signal input terminal 264. The equivalent circuit of the NAND gate 262 is substantially identical to the circuit shown in FIG. 3 for the NAND gate 64.

Each of the four inverters in the section 202 is formed of substantially the same equivalent circuit. A typical equivalent circuit for an inverter is the circuit 106 shown in FIG. 4, and described above.

Returning to FIG. 8, the signal (hereinafter "cka") appearing at output terminal 278 of inverter 266 is provided to input terminal 218 of gate 214, and to gate electrode 254 of transistor 236; the signal (hereinafter "ckb") appearing at output terminal 280 of inverter 268 is provided to the gate electrode of transistor 228 and to the gate electrode 252 of transistor 238; the signal (hereinafter "ckc") appearing at output terminal 282 of inverter 270 is provided to the gate terminal of the transistor 224, and the clock input signal appearing at the terminal 204 is provided to the input terminal 216 of the gate 214 and to the input terminal 248 of the transmission gate 236,238.

The operation of the circuit 200 is as follows, where reference is made to FIG. 8 and to FIG. 10, which is a timing diagram showing the time relationship of the signals appearing at various points in the circuit 200. In particular, the signals ck, cka, ckb, and ckc are shown, along with the signals appearing at the nodes p and pb, and at the positive and negative edge pulse output terminals 212 and 208, respectively. It is presumed that the enable signal terminal 264 is connected to a high logic state, so that the gate 262 acts as an inverter with respect to the signals appearing at its other input terminal. With the clock input signal ck in a high logic state at time zero, cka is at a low state as a result of the odd number of inverters (three) between terminals 204 and 278. Similarly, ckb is at a high state as a result of inverter 268, and ckc is at a low state as a result of inverter 270.

Because cka is low and ckb is high, transmission gate 236,238 conducts and provides the high state ck signal to the node p. Since ckb is high, transistor 234 is off, and does not load the node p. With node p high, transistor 226 is on, and maintains the positive-edge pulse output signal level at output terminal 212 in a low state. The high state ck signal also causes a low state signal to appear from gate 214 at node pb, turning transistor 222 off and turning transistor 230 on, which maintains the negative-edge pulse signal appearing at output terminal 208 in a high state.

At a time t1, input signal ck switches to a low state. As a result of the propagation delays caused by the inverter chain 262, 260 and 266, signals cka and ckc still remain low and ckb remains high. Thus, transmission gate 236,238 remains conducting and the low value of ck propagates to node p at a time t2 delayed from t1 by the propagation delay of the gate 236,238. The low signal at node p turns on transistor 232 and turns off transistor 226, thus pulling the positive pulse output signal at terminal 212 to a high level at a time t3 delayed from time t2 by the propagation delay of transistors 226 and 232.

In section 206, the action of ck switching to a low state causes the gate 214 and hence the node pb to switch high at the time t2, delayed from t1 by the delay of the gate 214. This action turns off transistor 230 and turns on transistor 222, pulling the negative-edge pulse signal at terminal 208 to a low state at time t3 delayed from t2 by the delay of transistors 222 and 230.

At a time t6 delayed from time t1 by the cumulative delays of the inverters 262, 260 and 266, the change in state of signal ck propagates to terminal 278 and causes cka to switch high. At time t7 delayed from t6 by the delay of inverter 280, the signal ckb switches low, and at a time t8 delayed from t7 by the delay of inverter 270, the signal ckc switches high. The transmission gate 236,238 turns off, transistor 234 turns on, which pulls node p to a high state at time t8, which in turn turns off transistor 232. The high value of ckc turns on transistor 224, which pulls the positive-edge pulse output signal at terminal 212 to a low value at time t9 delayed from t8 by the delay of transistor 224.

In section 206, the high level of cka causes gate 214 to pull node pb to a low level at time t7, turning off transistor 222. The low level of ckb turns on transistor 228, which pulls the negative-edge pulse signal at terminal 208 to a high level at time t8. When the clock signal ck subsequently returns to a high level, the values of the various signals are reset to those shown at time t0 in FIG. 10.

FIG. 11 is a graph showing the positive and negative pulses produced at the terminals 212 and 208, respectively, of circuit 200 in response to the leading edge of clock input signal ck having a fall time of three ns. Note the short delay in pulse generation from the start of the clock signal negative edge, and also note the nearly simultaneous time relationship between the complementary pulses.

The discussion of transconductances above in relation to the circuit 50 is equally applicable to the circuit 200, which is a dual of the circuit 50. Thus, the transconductance of the pull up transistor 230 is set to be less than (for example, 1/20) that of the opposing driver transistor 222. Since the purpose of the transistor 230 is simply to offset the PN junction leakage current of transistor 222, its adverse effect on circuit operation can be minimized by reducing its transconductance to a low value. In similar fashion and for similar reasons, the transconductance of the pull down transistor 226 is set to be less than (for example, 2/15) that of the opposing driver transistor 232. Also, the transconductance of transistors 230 and 226 is set to be less than that of transistors 228 and 224, respectively. The transconductance values of the driver transistors 222, 224, 228 and 232 are set to give the desired output pulse switching performance in consideration of the size of the loads to be driven.

The transconductance values of the transistors 236 and 238 are set substantially equal to each other to balance signal transmission performance. The transconductance values of the p-channel and n-channel transistors in each of the inverters in the circuit 200 are set substantially equal to each other to set the switching points of these elements to about one half the value of V+. The transconductance of the transistor 240 in the NOR gate 214 is preferably smaller than (for example, ½) that of the transistor 242 to ensure a sharp rise time at node pb when ck switches to a low level. The transconductance values of the other transistors in the circuit 200 are set as low as possible to minimize layout size and response time, while maintaining the capability of driving their intended loads.

Using the same fabrication parameters discussed above for the circuit 50, the following W/L ratios are suitable for use in fabricating the various transistors in the circuit 200:

| TRANSISTOR NO. | W/L RATIO |
| --- | --- |
| 222 | 25.6 |
| 224 | 19.2 |
| 226 | 2.56 |
| 228 | 38.4 |
| 230 | 2.56 |
| 232 | 38.4 |
| 234 | 12.8 |

-continued

| TRANSISTOR NO. | W/L RATIO |
|---|---|
| 236 | 12.8 |
| 238 | 6.4 |
| 240 | 3.84 |
| 242 | 7.68 |
| 244 | 32. |
| 246 | 32. |
| 260,270 | p = 5.12, n = 2.56 |
| 266,268 | p = 12.8, n = 6.4 |
| Gate 262 | 5.12 (all FETS) |

Referring to the section 202 of FIG. 8, the width of the output pulses produced by the circuit 200 is related to the number of inverters between the terminals 204 and 278. While three such elements are shown, any odd number may be used. Further, if an enable function is not desired, the gate 262 may be replaced by an inverter Thus, the section 202 may be envisioned as a series chain of 2N+1 inverters, where N is an integer greater than or equal to 1. The output terminal of the 2N+1st inverter provides the signal ckc, the output terminal of the 2Nth inverter provides the signal ckb, and the output terminal of the 2N-1th inverter provides the signal cka. The NAND gate may be substituted for the first inverter.

Figure 12:
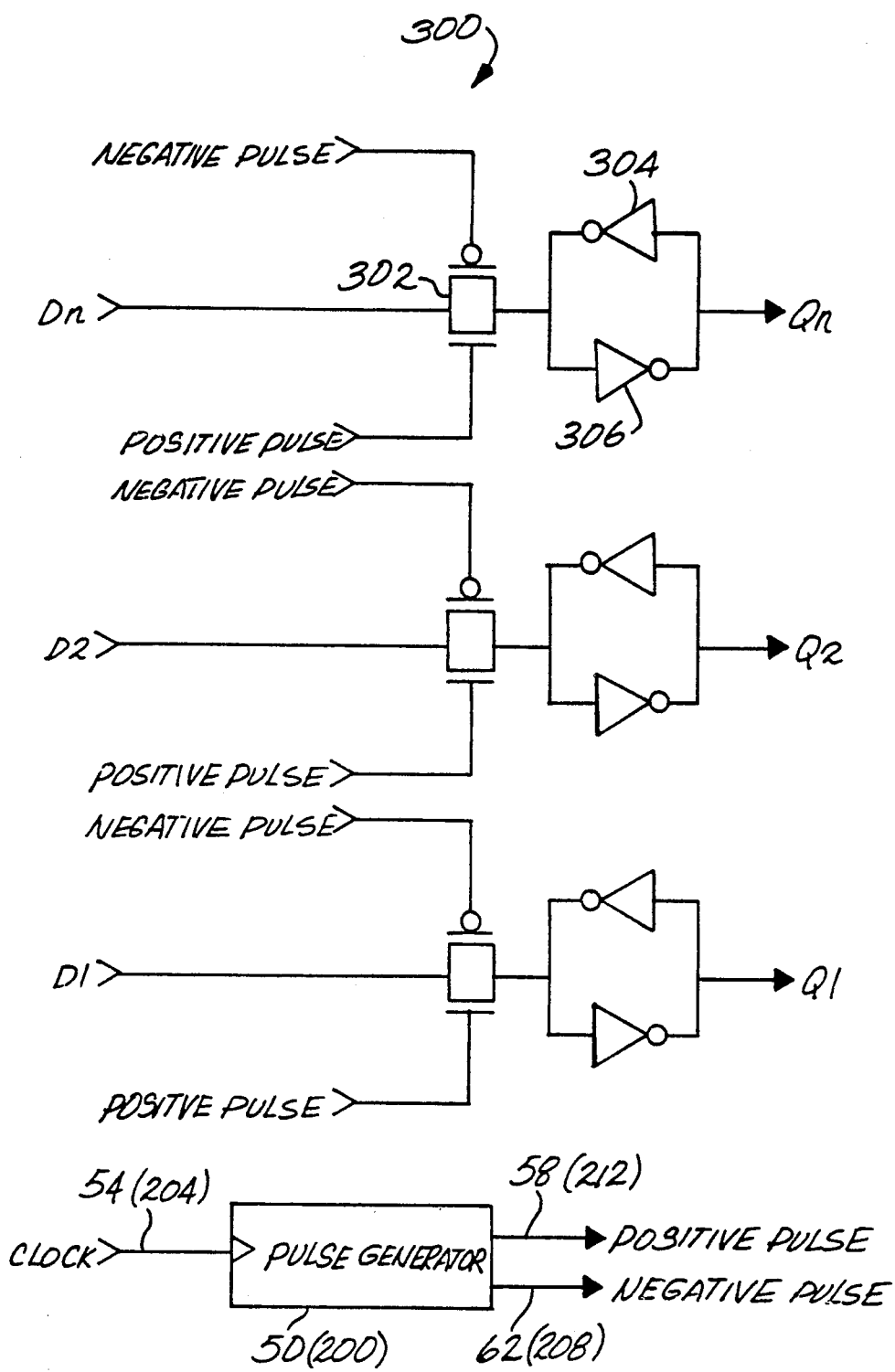
FIG. 12 is a block diagram showing the use of the circuits of FIGS. 2 or 8 in constructing an n-bit shift register.

A typical application for the circuits 50 and 200 is shown in FIG. 12, which is a block diagram of an n-bit shift register 300 where the positive and negative pulses from the circuit 50 or 200 are used to control a transmission gate 302 in each stage. The gate in turn provides input signals to a flip-flop created by antiparallel connection of two inverters 304,306.

While preferred embodiments of the invention have been shown and described, it is to be understood that various other adaptations and modifications may be made within the spirit and scope of the invention. It is thus intended that the invention be limited in scope only by the appended claims.

What is claimed is:

1. A pulse generator circuit (50) for producing substantially complementary output pulses in response to a clock input signal, comprising:

clock means (52) responsive to the clock input signal for providing a first clock signal which is the complement of the clock input signal and is delayed therefrom by a first delay interval, a second clock signal which is in phase with the clock input signal and is delayed therefrom by a second delay interval, and a third clock signal which is the complement of the clock input signal and is delayed therefrom by a third delay interval;

a first output circuit (56) having a first output node (58) for providing one of the said output pulses, a first pull-up transistor (72) for pulling a potential of the first output node up, and a first pull-down transistor (78) for pulling the potential of the first output node down in response to the second clock signal;

a first logic gate circuit (64) responsive to the clock input signal and the first clock signal for providing a first control signal to the first pull-up transistor so that the first pull-up transistor is turned on in response to the rise of the clock input signal and is turned off in response to a fall of the first clock signal before the first pull-down transistor is turned on;

a second output circuit (60) having a second output node (62) for providing another of said output pulses, a second pull-up transistor (74) for pulling a potential of the second output node up in response to the third clock signal, and a second pull-down transistor (82) for pulling the potential of the second output node down; and a second logic gate circuit (86, 88) responsive to the clock input signal, the first clock signal, and the second clock signal for providing a second control signal to the second pull-down transistor so that the second pull-down transistor is turned on in response to a rise of the clock input signal and is turned off in response to a rise of the second clock signal before the second pull-up transistor is turned on.

2. A pulse generator circuit according to claim 1 further comprising a third pull-down transistor (80) connected to the first output node and turned on in response to the first control signal before the first pull-down transistor is turned on, wherein a transconductance of the first pull-down transistor is less than a transconductance of the first pull-up transistor and the first pull-down transistor.

3. A pulse generator circuit according to the claim 1 further comprising a third pull-up transistor (76) connected to the second output node and turned on in response to the second control signal before the second pull-up transistor is turned on, wherein a transconductance of the third pull-up transistor is less than a transconductance of the second pull-up transistor and the second pull-down transistor.

4. A pulse generator circuit according to claim 1 wherein the second logic gate circuit comprises a CMOS transmission gate (86, 88) controlled by the first and second clock signals, for selectively transferring the clock input signal, and a fourth pull-down transistor (84) for pulling down a potential of an output of the CMOS transmission gate in response to the second clock signal when the CMOS transmission gate is turned off.

5. A pulse generator circuit according to claim 4 wherein the first logic gate circuit comprises a NAND gate (64) receiving the clock input signal and the first clock signal and providing the first control signal.

6. A pulse generator circuit according to claim 1 wherein a pulse width of the clock input signal is greater than a pulse width of the complementary output pulses.

7. A pulse generator circuit according to claim 1 wherein the second delay interval is greater than the first delay interval, and the third delay interval is greater than the second delay interval.

8. A pulse generator circuit according to the claim 1 wherein the second delay interval is less than the first delay interval, and the third delay interval is greater than the first delay interval.

9. A pulse generator circuit according to claim 1 wherein the second delay interval is greater than the first delay interval, and the third delay interval is substantially equal to the first delay interval.

10. A pulse generator circuit according to claim 1 wherein the second delay interval is less than the first delay interval, and the third delay interval is substantially equal to the first delay interval.

11. A pulse generator circuit (200) for producing substantially complementary output pulses in response to a clock input signal comprising:

clock means (202) responsive to the clock input signal for providing a first clock signal which is the complement of the clock input signal and is delayed therefrom by a first delay interval, a second clock signal which is in phase with the clock input signal and is delayed therefrom by a second delay interval, and a third clock signal which is the complement of the clock input signal and is delayed therefrom by a third delay interval;

a first output circuit (206) having a first output node (208) for providing one of said output pulses, a first pull-up transistor (228) for pulling a potential of the first output node up in response to the second clock signal and a first pull-down transistor (222) for pulling the potential of the first output node down;

a first logic gate circuit (214) responsive to the clock input signal and the first clock signal for providing a first control signal to the first pull-down transistor so that the first pull-down transistor is turned on in response to a fall of the clock input signal and is turned off in response to a rise of the first clock signal before the first pull-up transistor is turned on;

a second output circuit (210) having a second output node (212) for providing another of said output pulses, a second pull-up transistor (232) for pulling a potential of the second output node up, and a second pull-down transistor (224) for pulling the potential of the second output node down in response to the third clock signal; and a second logic gate circuit (236, 238) responsive to the clock input signal, the first clock signal, and second clock signal for providing a second control signal to the second pull-up transistor so that the second pull-up transistor is turned on in response to a fall of the clock input signal and is turned off in response to a fall of the second clock signal before the second pull-down transistor is turned on.

12. A pulse generator circuit according to claim 11 further comprising a third pull-up transistor (230) connected to the first output node and turned on in response to the first control signal before the first pull-up transistor is turned on, wherein a transconductance of the third pull-up transistor is less than a transconductance of the first pull-up transistor and the first pull-down transistor.

13. A pulse generator circuit according to claim 11 further comprising a third pull-down transistor (226) connected to the second output node and turned on in response to the second control signal before the second pull-down transistor is turned on, wherein a transconductance of the third pull-down transistor is less than a transconductance of the second pull-up transistor and the second pull-down transistor.

14. A pulse generator circuit according to claim 11 wherein the second logic gate circuit comprises a CMOS transmission gate, (236, 238) controlled by the first and second clock signals, for selectively transferring the clock input signal, and a fourth pull-up transistor (234) for pulling up a potential of an output of the CMOS transmission gate in response to the second clock signal when the CMOS transmission gate is turned off.

15. A pulse generator circuit according to claim 14 wherein the first logic gate circuit comprises a NOR gate (214) receiving the clock input signal and the first clock signal and providing the first control signal.

16. A pulse generator circuit according to claim 11 wherein a pulse width of the clock input signal is greater than a pulse width of the complementary output pulses.

17. A pulse generator circuit according to claim 11 wherein the second delay interval is greater than the first delay interval, and the third delay interval is greater than the second delay interval.

18. A pulse generator circuit according to claim 11 wherein the second delay interval is greater than the first delay interval, and the third delay interval is greater than the first delay interval.

19. A pulse generator circuit according to claim 11 wherein the second delay interval is greater than the first delay interval, and the third delay interval is substantially equal to the first delay interval.

20. A pulse generator circuit according to claim 11 wherein the second delay interval is greater than the first delay interval, and the third delay interval is substantially equal to the first delay interval.

* * * * *

UNITED STATES PATENT AND TRADEMARK OFFICE
CERTIFICATE OF CORRECTION

PATENT NO. : 5,270,580
DATED : December 14, 1993
INVENTOR(S) : Huy S. Nguyen

It is certified that error appears in the above-indentified patent and that said Letters Patent is hereby corrected as shown below:

Column 1, line 32, after "complimentary metal-" insert -- oxide-semiconductor) circuit which, under certain design --.
Column 1, line 58, after "terminal" insert a period.

Column 9, line 27, after "inverter" change the comma to a period.
Column 9, line 52, after "signal" insert a period.

Column 10, line 21, after "connected" insert -- to --.
Column 10, line 61, after "terminal of" delete "a".
Column 10, line 68, after "FIG. 4" change "and" to -- as --.

UNITED STATES PATENT AND TRADEMARK OFFICE
CERTIFICATE OF CORRECTION

PATENT NO. : 5,270,580
DATED : December 14, 1993
INVENTOR(S) : Huy S. Nguyen

It is certified that error appears in the above-indentified patent and that said Letters Patent is hereby corrected as shown below:

```
Column 14, line 21, before "pull-down" change "first" to
           -- third --.
Column 14, line 24, before "claim 1" delete "the".
Column 14, line 54, before "claim 1" delete "the".

Column 16, line 33, after "interval is" change "greater"
           to -- less --.
Column 16, line 41, after "interval is" change "greater"
           to -- less --.
```

Signed and Sealed this

Second Day of August, 1994

*Attest:*

BRUCE LEHMAN

*Attesting Officer*     *Commissioner of Patents and Trademarks*